(12) United States Patent
Honda et al.

(10) Patent No.: US 11,463,060 B2
(45) Date of Patent: *Oct. 4, 2022

(54) POWER AMPLIFIER CIRCUIT

(71) Applicant: Murata Manufacturing Co., Ltd., Kyoto (JP)

(72) Inventors: Yuri Honda, Kyoto (JP); Fumio Harima, Kyoto (JP); Yoshiki Kogushi, Kyoto (JP); Shota Ishihara, Kyoto (JP); Fuminori Morisawa, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/038,988

(22) Filed: Sep. 30, 2020

(65) Prior Publication Data

US 2021/0013855 A1    Jan. 14, 2021

Related U.S. Application Data

(63) Continuation of application No. 16/135,787, filed on Sep. 19, 2018, now Pat. No. 10,826,453.

(Continued)

(51) Int. Cl.
*H03F 1/22* (2006.01)
*H03G 3/30* (2006.01)
(Continued)

(52) U.S. Cl.
CPC ......... *H03G 3/3042* (2013.01); *H03F 1/0216* (2013.01); *H03F 3/195* (2013.01); *H03F 3/211* (2013.01); *H03G 1/0023* (2013.01); *H03F 1/22* (2013.01); *H03F 2200/144* (2013.01); *H03F 2200/372* (2013.01); *H03F 2203/21112* (2013.01)

(58) Field of Classification Search
CPC ......................................................... H03F 1/22
USPC .................................. 330/311, 296, 285, 75
See application file for complete search history.

(56) References Cited

U.S. PATENT DOCUMENTS 4,460,876 A * 7/1984 Najman .................... H03G 3/02
330/296
7,646,252 B2 * 1/2010 Banba ..................... H03F 1/565
330/311

(Continued)

FOREIGN PATENT DOCUMENTS

JP      2015-095708 A    5/2015
KR   10-2015-0070011 A    6/2015
WO      2017/105213 A1    6/2017

*Primary Examiner* — Henry Choe
(74) *Attorney, Agent, or Firm* — Pearne & Gordon LLP

(57) ABSTRACT

The present disclosure provides a power amplifier circuit capable of suppressing the occurrence of noises while enabling control of an output power level. The power amplifier circuit includes a first transistor that amplifies a first signal; a bias circuit that supplies a bias current or voltage based on a control signal to the first transistor; a second transistor to which a control current based on the control signal is supplied, which has an emitter or a source thereof connected to a collector or a drain of the first transistor, and from which a second signal obtained by amplifying the first signal is output; and a first feedback circuit provided between the collector or the drain of the second transistor and the base or the gate of the second transistor.

9 Claims, 9 Drawing Sheets

Related U.S. Application Data

(60) Provisional application No. 62/565,412, filed on Sep. 29, 2017.

(51) Int. Cl.
*H03F 3/21* (2006.01)
*H03F 3/195* (2006.01)
*H03F 1/02* (2006.01)
*H03G 1/00* (2006.01)

(56) References Cited

U.S. PATENT DOCUMENTS

| | | |
|---|---|---|
| 7,956,682 B2 | 6/2011 | Hasegawa |
| 8,294,523 B2 * | 10/2012 | Thomas .................. H03F 3/50 |
| | | 330/296 |
| 9,559,654 B2 | 1/2017 | Nakamura et al. |
| 2004/0207471 A1 | 10/2004 | Raja et al. |
| 2006/0208802 A1 | 9/2006 | Minichshofer |
| 2008/0169877 A1 | 7/2008 | Banba |
| 2011/0163810 A1 | 7/2011 | Thomas |
| 2015/0130537 A1 | 5/2015 | Nakamura et al. |
| 2015/0171794 A1 | 6/2015 | Takahashi et al. |
| 2018/0351514 A1 | 12/2018 | Oon et al. |

* cited by examiner

POWER AMPLIFIER CIRCUIT

CROSS REFERENCE TO RELATED APPLICATIONS

This is a Continuation of U.S. patent application Ser. No. 16/135,787 filed Sep. 19, 2018, which claims priority to U.S. Provisional Application Ser. No. 62/565,412, filed on Sep. 29, 2017, entitled "POWER AMPLIFIER CIRCUIT", the entireties of which are incorporated herein by reference.

BACKGROUND

Field

The present disclosure relates to a power amplifier circuit.

Description of Related Art

A mobile communication device, such as a cellular phone, includes a power amplifier circuit that amplifies the power of a transmission signal to a level required for the transmission to a base station. As an example of such a power amplifier circuit, there has been known, for example, a configuration that controls the output power level of a transmission signal by making a bias current variable. In such a configuration, the output power unexpectedly fluctuates, in some cases, as the power level of an input signal increases. As an example of a conceivable configuration for suppressing such changes, an additional transistor is cascode-connected to a transistor that amplifies the power of a transmission signal. According to this configuration, changes in the collector current of a lower-stage transistor to which the transmission signal is input are restricted by an upper-stage transistor, thus making it possible to suppress changes in the output power to be output from the upper-stage transistor.

However, in the cascode configuration described above, a noise included in the base current of the upper-stage transistor could be mixed with a transmission signal supplied to the lower-stage transistor and turned into a noise having a frequency near the frequency band of the transmission signal, the noise appearing at the collector of the upper-stage transistor. Further, if the frequency of the noise falls within the frequency band of a received signal, then the receiving sensitivity could be deteriorated.

SUMMARY

The present disclosure is made in view of the background described above, and it is an object of the disclosure to provide a power amplifier circuit capable of suppressing the occurrence of a noise while enabling control of an output power level.

To this end, a power amplifier circuit according to one aspect of the present disclosure includes: a first transistor that amplifies a first signal input to a base or a gate thereof; a bias circuit that supplies a bias current or voltage based on a control signal to the base or the gate of the first transistor; a second transistor in which a control current based on the control signal is supplied to a base or a gate thereof, an emitter or a source thereof is connected to a collector or a drain of the first transistor, and a second signal obtained by amplifying the first signal is output from a collector or a drain thereof; and a first feedback circuit provided between the collector or the drain of the second transistor and the base or the gate of the second transistor.

The above configuration and subject matter of the present disclosure makes it possible to provide a power amplifier circuit capable of suppressing the occurrence of a noise while enabling control of an output power level.

DETAILED DESCRIPTION

Figure 1:
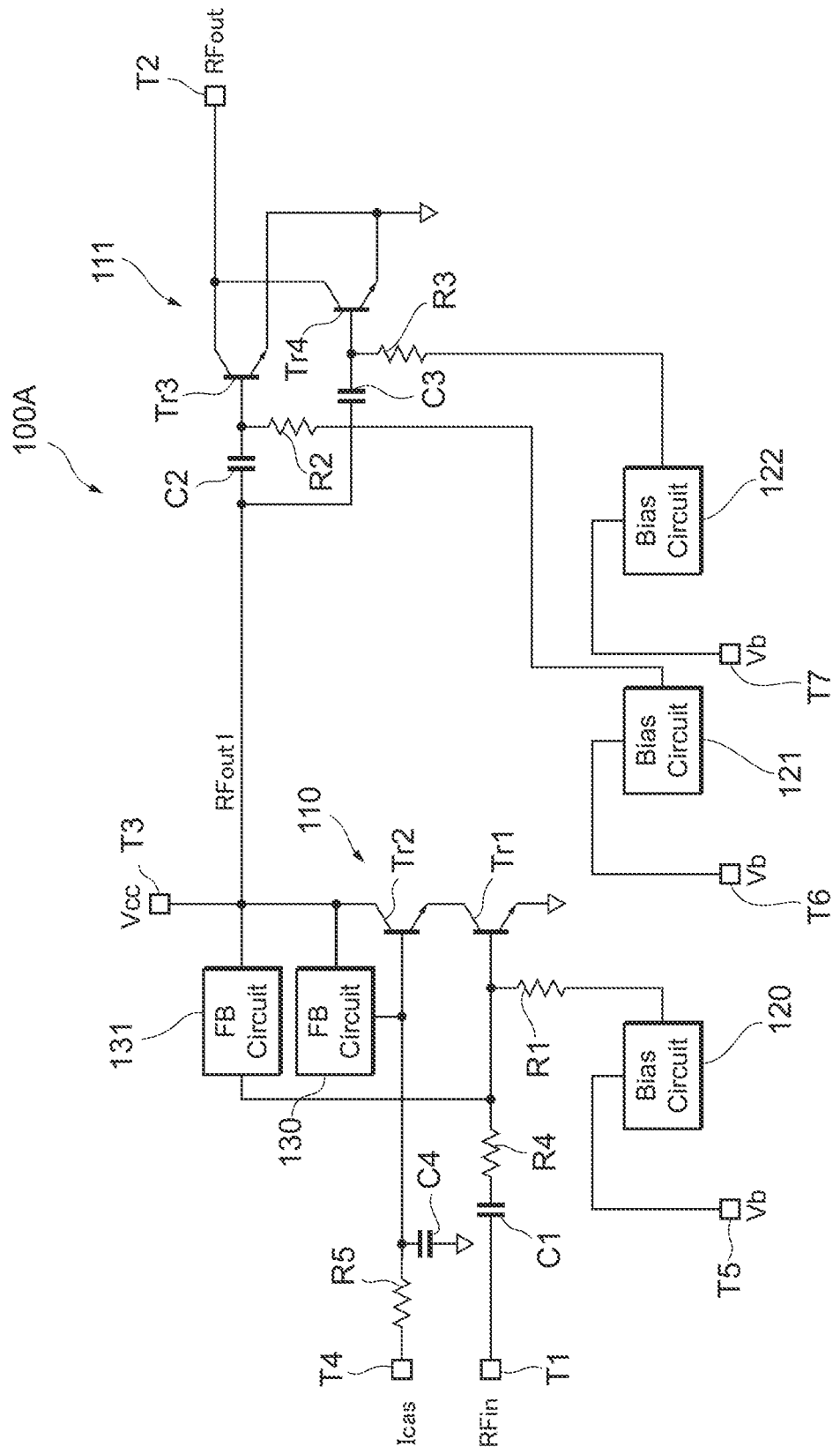
FIG. 1 is a diagram illustrating a configuration example of a power amplifier circuit according to a first embodiment of the present disclosure.

The following will describe in detail the embodiments of the present disclosure with reference to the accompanying drawings. Like elements will be assigned like reference numerals and the descriptions thereof will not be repeated.

FIG. 1 is a diagram illustrating a configuration example of a power amplifier circuit according to a first embodiment of the present disclosure. In, for example, a mobile communication device, such as a cellular phone, a power amplifier circuit 100A illustrated in the diagram amplifies the power of a radio frequency (RF) signal to a level required for the transmission to a base station. The frequency of the RF signal amplified by the power amplifier circuit 100A is, for example, approximately a few GHz. Further, the power amplifier circuit 100A has an operation mode, in which a gain characteristic is controlled on the basis of a control signal thereby to control the level of the output power of a transmission signal. The gain characteristic may be controlled by current or voltage. The following will describe a configuration example in which the level of output power is controlled by a control voltage (hereinafter may be referred to as "the level control voltage").

To be specific, the power amplifier circuit 100A includes, for example, amplifiers 110, 111, bias circuits 120 to 122, feedback circuits 130, 131, capacitors C1 to C4, and resistance elements R1 to R5.

The power amplifier circuit 100A includes two stages of amplifiers. The amplifier 110 of an initial stage (drive stage) includes transistors Tr1, Tr2. The amplifier 111 of a later stage (power stage) includes transistors Tr3, Tr4. The amplifier 110 of the initial stage amplifies an RF signal RFin (a first signal) supplied from an input terminal T1 and outputs an amplified signal RFout1 (a second signal). The amplifier 111 of the later stage amplifies the amplified signal RFout1 supplied from the amplifier 110 of the initial stage and outputs an amplified signal RFout from an output terminal T2.

The following description will be given, assuming that each of the transistors Tr1 to Tr4 is composed of a heterojunction bipolar transistor (HBT). One or all of the transistors Tr1 to Tr4 may alternatively be composed of field-effect transistors, such as metal-oxide-semiconductor field-effect transistors (MOSFETs) instead of bipolar transistors. In this case, a collector, a base, and an emitter should be replaced by a drain, a gate, and a source, respectively. The same will apply to transistors Tr5, Tr6, which will be discussed later.

The transistor Tr1 and the transistor Tr2 are cascode-connected. More specifically, in the lower-stage transistor Tr1 (a first transistor), the collector thereof is connected to the emitter of the transistor Tr2 (a second transistor), the RF signal RFin is supplied to the base thereof, and the emitter is connected to the ground. A bias current or voltage is supplied to the base of the transistor Tr1 from a bias circuit 120 via a resistance element R1. The gain characteristic of the transistor Tr1 is controlled on the basis of the level of the bias current or voltage supplied from the bias circuit 120.

In the upper-stage transistor Tr2 (the second transistor), a supply voltage Vcc is supplied to the collector thereof from a terminal T3, a control current Icas is supplied to the base thereof from a terminal T4, and the emitter thereof is connected to the collector of the transistor Tr1. The control current Icas is, for example, a current that changes according to the level control voltage. More specifically, the control current Icas may alternatively be, for example, a current that changes according to a relationship of an approximate square with respect to the level control voltage. Further, the base of the transistor Tr2 is connected to the ground via the capacitor C4.

According to the configuration described above, in the amplifier 110 of the initial stage, the RF signal RFin supplied to the lower-stage transistor Tr1 is amplified by the transistor Tr1 and the transistor Tr2 and then output from the collector of the upper-stage transistor Tr2. Further, the cascode connection of the transistor Tr2, which has the base current thereof controlled by the control current Icas, to the transistor Tr1 provides the following effects.

If the level control voltage is constant, then the output power preferably remains constant. However, if the amplifier 110 were not provided with the upper-stage transistor Tr2, then the base bias of the transistor Tr1 would fluctuate as the power of the RF signal RFin increases and the power of the amplified signal output from the collector of the transistor Tr1 might also fluctuate. In this respect, the present embodiment has the transistor Tr2 cascode-connected to the transistor Tr1. In addition, the collector current of the transistor Tr2 is controlled by the control current Icas supplied to the base thereof. Thus, the changes in the power of the amplified signal RFout1 can be suppressed by controlling the control current Icas so as to suppress the changes in the power at the collector of the lower-stage transistor Tr1.

Meanwhile, the transistor Tr3 and the transistor Tr4 are interconnected in parallel to each other. More specifically, in the transistors Tr3, Tr4, the supply voltage Vcc is supplied to the collectors thereof, the amplified signal RFout1 is supplied to the bases thereof via the capacitors C2, C3, and the emitters thereof are connected to the ground. Further, bias currents or voltages are supplied to the bases of the transistors Tr3, Tr4 from bias circuits 121, 122 via the resistance elements R2, R3, respectively. Thus, the transistors Tr3, Tr4 output, from the collectors thereof, the amplified signals RFout obtained by amplifying the amplified signal RFout1. The gain characteristics of the transistors Tr3, Tr4 are controlled on the basis of, for example, the levels of the bias currents or voltages supplied from the bias circuits 121, 122.

Further, the turning ON/OFF of the transistor Tr3 and the transistor Tr4 may be controlled according to the operation mode of the power amplifier circuit 100A. To be specific, if, for example, the power required for a transmission signal is a predetermined level or more and if the power amplifier circuit 100A operates in a high-power mode, then the bias currents or voltages are supplied from both the bias circuits 121, 122 so as to turn on both the transistors Tr3, Tr4. On the other hand, if the power required for a transmission signal is below the predetermined level and if the power amplifier circuit 100A operates in a low-power mode, then a bias current or voltage is supplied from one of the bias circuits 121, 122 so as to turn on one of the transistors Tr3, Tr4.

The bias circuit 120 generates a bias current or voltage based on a bias control voltage Vb supplied from a terminal T5 and supplies the generated bias current or voltage to the base of the transistor Tr1. Similarly, the bias circuits 121, 122 generate bias currents or voltages based on the bias control voltage Vb supplied from the terminals T6, T7 and supply the generated bias currents or voltages to the bases of the transistors Tr3, Tr4. The bias control voltage Vb is, for example, a voltage that changes according to the level control voltage, as with the control current Icas. Thus, the level of the bias current or voltage generated by the bias circuits 120 to 122 is controlled, consequently controlling the gain characteristics of the amplifiers 110, 111. More specifically, the bias control voltage Vb may be, for example, a voltage that changes according to a relationship of an approximate square with respect to the level control voltage. If both the control current Icas and the bias control voltage Vb change according to the relationship of an approximate square with respect to the level control voltage, then the control current Icas and the bias control voltage Vb will have a proportional relationship.

Figure 2:
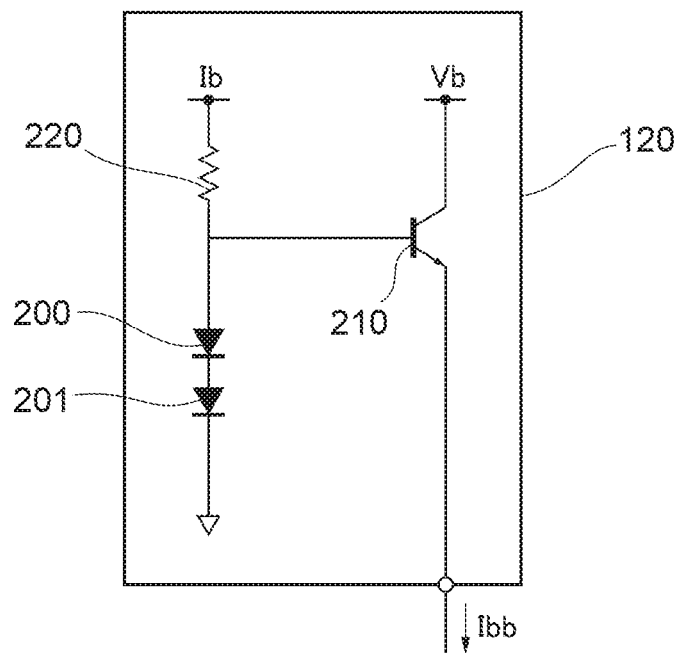
FIG. 2 is a diagram illustrating a configuration example of a bias circuit 120.

FIG. 2 is a diagram illustrating a configuration example of the bias circuit 120. The configurations of the bias circuits 121, 122 are the same as the configuration of the bias circuit 120, so that a detailed description thereof will be omitted. As illustrated in FIG. 2, the bias circuit 120 includes diodes 200, 201, a transistor 210, and a resistance element 220.

The diode 200 and the diode 201 are connected in series. A current Ib is supplied to the anode of the diode 200 via the resistance element 220, and the cathode of the diode 201 is connected to the ground. Thus, a voltage of a predetermined level (e.g. approximately 2.6 V) is generated at the anode of the diode 200. In place of the diodes 200, 201, a transistor having the collector and the base thereof connected may be used.

In the transistor 210, the bias control voltage Vb is supplied to the collector thereof, the base thereof is connected to the anode of the diode 200, and the emitter thereof is connected to one end of the resistance element R1. The bias control voltage Vb is a voltage that changes according to the level control voltage as described above, so that the transistor 210 outputs a bias current Ibb based on the level control voltage from the emitter thereof.

Referring back to FIG. 1, the feedback circuit 130 (a first feedback circuit) is provided between the collector and the base of the upper-stage transistor Tr2 to adjust the gain of the transistor Tr2. The configuration of the feedback circuit 130 will be described later in detail.

The feedback circuit 131 (a second feedback circuit) is provided between the collector of the upper-stage transistor Tr2 and the base of the lower-stage transistor Tr1 to suppress the oscillation of the amplifier 110. The configuration of the feedback circuit 131 will be described later in detail.

The capacitors C1 to C3 are connected in series to the bases of the transistors Tr1, Tr3, and Tr4, respectively, to remove the DC components of the RF signals. The capacitor C4 is provided between the base of the transistor Tr2 and the ground so as to connect the base of the transistor Tr2 to the ground in an alternate manner. In other words, the transistor Tr2 is base-grounded.

The resistance elements R1 to R3 are provided between the bias circuits 120 to 122 and the bases of the transistors Tr1, Tr3 and Tr4, respectively. A resistance element R4 is connected in series to the base of the transistor Tr1. A resistance element R5 is connected in series to the base of the transistor Tr2. A resistance element R5 is provided to prevent a large current from passing between the base and the collector of the transistor Tr2 in the case where, for example, the supply voltage Vcc becomes approximately 0 V due to a failure or the like of the power amplifier circuit 100A. The resistance element R5 and the capacitor C4 constitute a low-pass filter circuit for the control current Icas.

Further, although not illustrated in FIG. 1, matching circuits for matching inter-circuit impedance may be provided between the input terminal T1 and the amplifier 110 in the initial stage, between the amplifier 110 in the initial stage and the amplifier 111 in the later stage, and between the amplifier 111 in the later stage and the output terminal T2.

Before describing in detail the configurations of the feedback circuits 130, 131, a problem in a case where the feedback circuit 130 is not provided will be described. The amplifier 110 of the initial stage in the power amplifier circuit 100A includes a cascode configuration to suppress changes in the power of the amplified signal RFout1. However, adopting the cascode configuration for an amplifier causes the RF signal RFin supplied to the base of the lower-stage transistor Tr1 to be mixed with the noises coming from the bias circuit 120 and the resistance element R1, and the resultant noise appears at the collector of the transistor Tr1. The noise is further amplified by the base-grounded, upper-stage transistor Tr2 and appears at the collector of the transistor Tr2. As a result, the noise is more amplified than in the case where the cascode configuration is not adopted.

Figure 3:
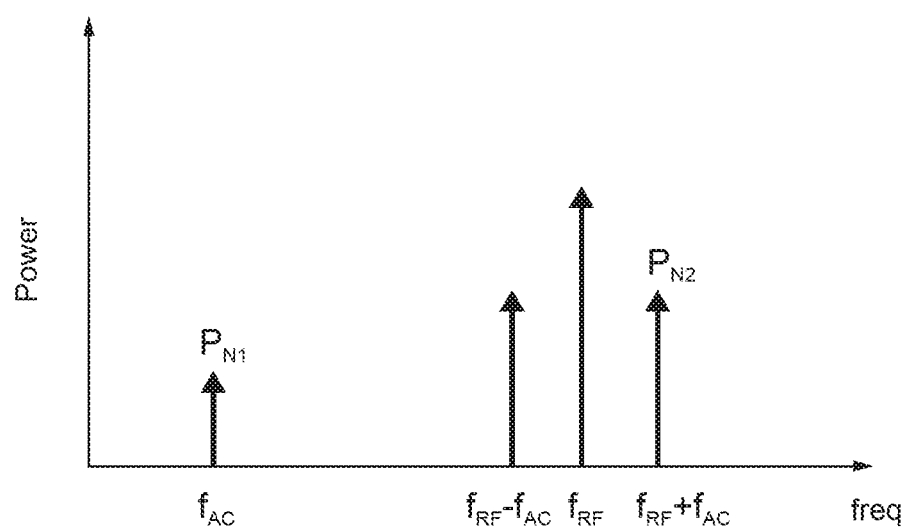
FIG. 3 is a diagram illustrating the concept of the spectra of signals that appear at the collector of an upper-stage transistor Tr2.

FIG. 3 is a diagram illustrating the concept of the spectra of signals that appear at the collector of the upper-stage transistor Tr2. In the diagram given in FIG. 3, the axis of abscissa indicates frequency and the axis of ordinate indicates power.

First, the frequency of the RF signal RFin supplied to the base of the lower-stage transistor Tr1 is denoted by $f_{RF}$, and the frequency of a noise entering the base of the upper-stage transistor Tr2 is denoted by $f_{AC}$. If these signals are mixed in the transistor Tr1 and the transistor Tr2, which are cascode-connected, then a signal having the frequency $f_{RF}$ (the desired transmission signal), a signal having the frequency of $f_{AC}$ (noise), a signal having a frequency of $f_{RF}+f_{AC}$ (noise), and a signal having a frequency of $f_{RF}-f_{AC}$ (noise) appear at the collector of the transistor Tr2. In general, the frequencies in a reception frequency band are frequently higher than the frequencies in a transmission frequency band. Hence, among the above noises, the signal having the frequency $f_{RF}+f_{AC}$, in particular, tends to fall within the receiving band and become a receiving band noise that may deteriorate the receiving sensitivity.

Thus, the gain (the so-called conversion gain) of power $P_{N2}$ of the noise having the frequency $f_{RF}+f_{AC}$ appearing at the collector of the transistor Tr2 with respect to power $P_{N1}$ of the noise having the frequency $f_{AC}$ entering the base of the transistor Tr2 causes a problem especially in the case where the output power falls within a certain range. This will be described with reference to FIG. 4.

Figure 4:
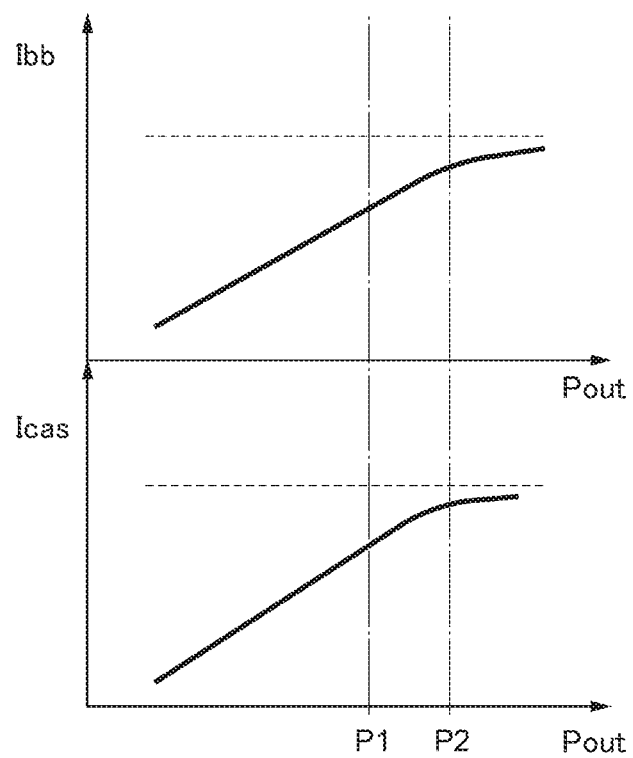
FIG. 4 is a graph illustrating the relationship between output power Pout and a bias current Ibb, and a control current Icas.

FIG. 4 is a graph illustrating the relationship between the output power Pout and the bias current Ibb and the control current Icas. In the graph illustrated in FIG. 4, the axis of abscissa indicates the output power Pout, and the axis of ordinate indicates the bias current Ibb and the control current Icas. Further, the solid lines denote the characteristic observed in the operation mode in which the output power is variably controlled by the level control voltage, and the dashed lines denote the characteristic observed in the operation mode in which the output power is not variably controlled (i.e. the output power remains constant).

As illustrated in FIG. 4, the current amounts of both the bias current Ibb and the control current Icas increase as the output power Pout increases. If the output power falls within a range below a first level P1, then the gain of the transistor Tr2 is relatively low, because the current amount of the control current Icas (i.e. the base current of the transistor Tr2) is relatively small. Hence, the conversion gain is low, thus suppressing the receiving band noises.

On the other hand, if the output power falls within a range that is equal to or more than the first level P1 and below a second level that is higher than the first level P1 (P1<P2), then the current amounts of the bias current Ibb and the control current Icas will be relatively large and the gains of the transistors Tr1 and Tr2 will be relatively high. Thus, the noises entering the base of the transistor Tr2 are amplified at a relatively high gain, so that the conversion gain will be high accordingly. Therefore, the receiving band noises will be larger.

If the output power falls within a range of the second level P2 or higher, then the current amounts of the bias current Ibb and the control current Icas will be further increased, approaching a level observed in the operation mode in which the output power is not variably controlled. Hence, the conversion gain and the receiving band noise based thereon will be approximately the same as those in the case where the output power is not variably controlled.

Figure 5:
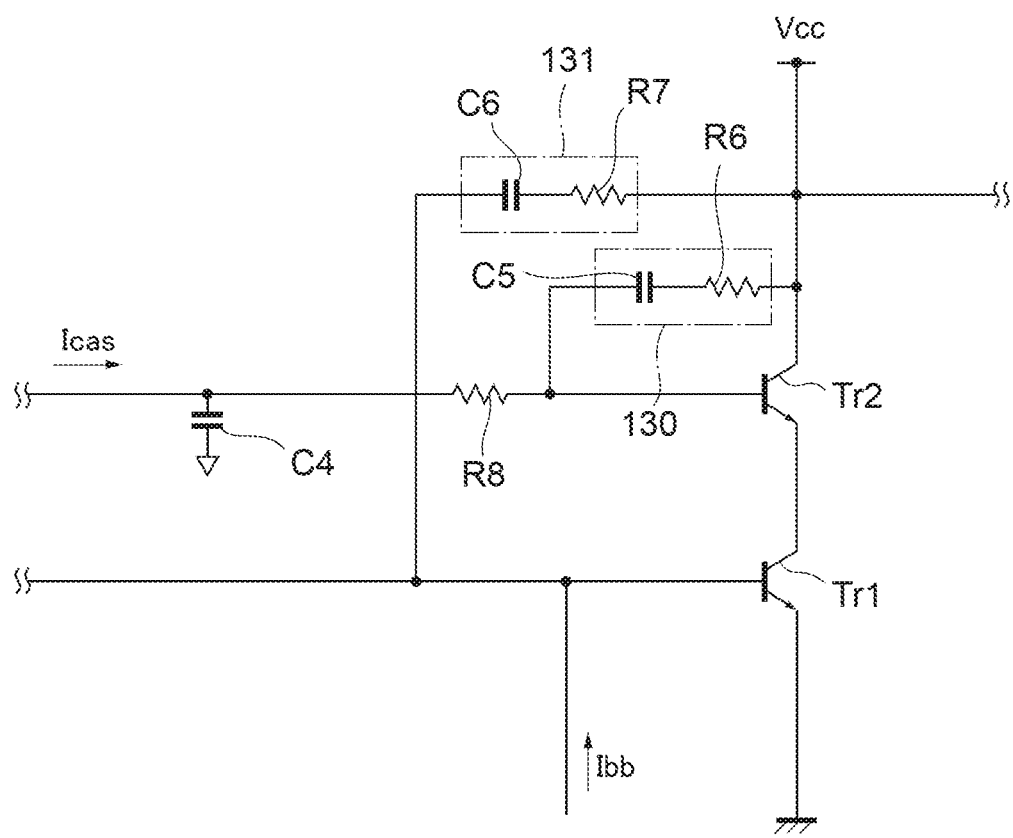
FIG. 5 is a diagram illustrating the configuration examples of feedback circuits 130 and 131.

Thus, if the output power of the amplifier 110 falls within the range from the first level P1 to the second level P2, then an increase in the conversion gain, in particular, will be a problem. As a solution to the problem, the power amplifier circuit 100A is provided with the feedback circuit 130 so as to suppress the receiving band noises. Referring now to FIG. 5, the detailed configurations and the functions of the feedback circuits 130, 131 will be described.

FIG. 5 is a diagram illustrating the configuration examples of the feedback circuits 130, 131. In FIG. 5, the configurations related to the feedback circuits 130, 131 are illustrated, whereas the remaining configurations are not illustrated.

The feedback circuit 130 includes a capacitor C5 and a resistance element R6. The capacitor C5 (a first capacitor) and the resistance element R6 (a first resistance element) are interconnected in series, electrically connecting the collector and the base of the transistor Tr2. The capacitor C5 feeds back a signal output from the collector of the transistor Tr2 to the base, which is an input. The resistance element R6 adjusts the feedback amount on the basis of a resistance value. This configuration enables the feedback circuit 130 to decrease the gain of the transistor Tr2, as desired.

The feedback circuit 131 includes a capacitor C6 and a resistance element R7. The capacitor C6 (a second capacitor) and the resistance element R7 (a second resistance element) are interconnected in series, electrically connecting the collector of the transistor Tr2 and the base of the transistor Tr1. The capacitor C6 feeds back a signal output from the collector of the transistor Tr2 to the base of the transistor Tr1, which is an input. The resistance element R7 adjusts the feedback amount on the basis of a resistance value. This configuration enables the feedback circuit 131 to suppress the oscillation of the amplifier 110, thus making it possible to improve the stability thereof.

In a resistance element R8, the control current Icas is supplied to one end thereof, and the other end thereof is connected to one end of the capacitor C5. The resistance element R8 makes it possible to decrease the gain of the transistor Tr2, as desired, by weakening the degree of the base grounding of the transistor Tr2 by the capacitor C4.

As described above, in the power amplifier circuit 100A, the feedback circuit 130 and the resistance element R8 are connected to the cascode-connected upper-stage transistor Tr2. With this arrangement, even if the output power falls within the range between the first level P1 and the second level P2, which is illustrated in FIG. 4, the gain of the transistor Tr2 is reduced, so that the conversion gain of the amplifier 110 is reduced accordingly. Hence, the power amplifier circuit 100A makes it possible to suppress the occurrence of receiving band noises while enabling control of an output power level.

Further, in the power amplifier circuit 100A, the feedback amount of the feedback circuit 131 may be decreased by, for example, decreasing the capacitance value of the capacitor C6 according to a decrease in the gain of the upper-stage transistor Tr2. This causes the gain of the lower-stage transistor Tr1 to increase, making it possible to prevent a decrease in the gain of the amplifier 110 as a whole. To be specific, for example, the capacitance value of the capacitor C6 included in the feedback circuit 131 may be set to be lower than the capacitance value of the capacitor C5 included in the feedback circuit 130. This makes it possible to prevent a decrease in the gain of the amplifier 110, to decrease the resistance value of the resistance element R7, and to suppress thermal noises in the resistance element R7.

The configurations of the feedback circuits 130, 131 illustrated in FIG. 5 are merely examples and are not to be limited thereto. For example, the feedback circuit 130 may not include the resistance element R6, and the feedback circuit 131 may not include the resistance element R7. Further, the power amplifier circuit 100A may not include the resistance element R8.

Further, the feedback circuit 130 may be provided in the lower-stage transistor Tr1, as with the upper-stage transistor Tr2.

Further, the power amplifier circuit 100A may be configured to be switchable between the operation mode in which the output power can be variably controlled by the level control voltage and the operation mode in which the power amplification factor remains constant.

Figure 6:
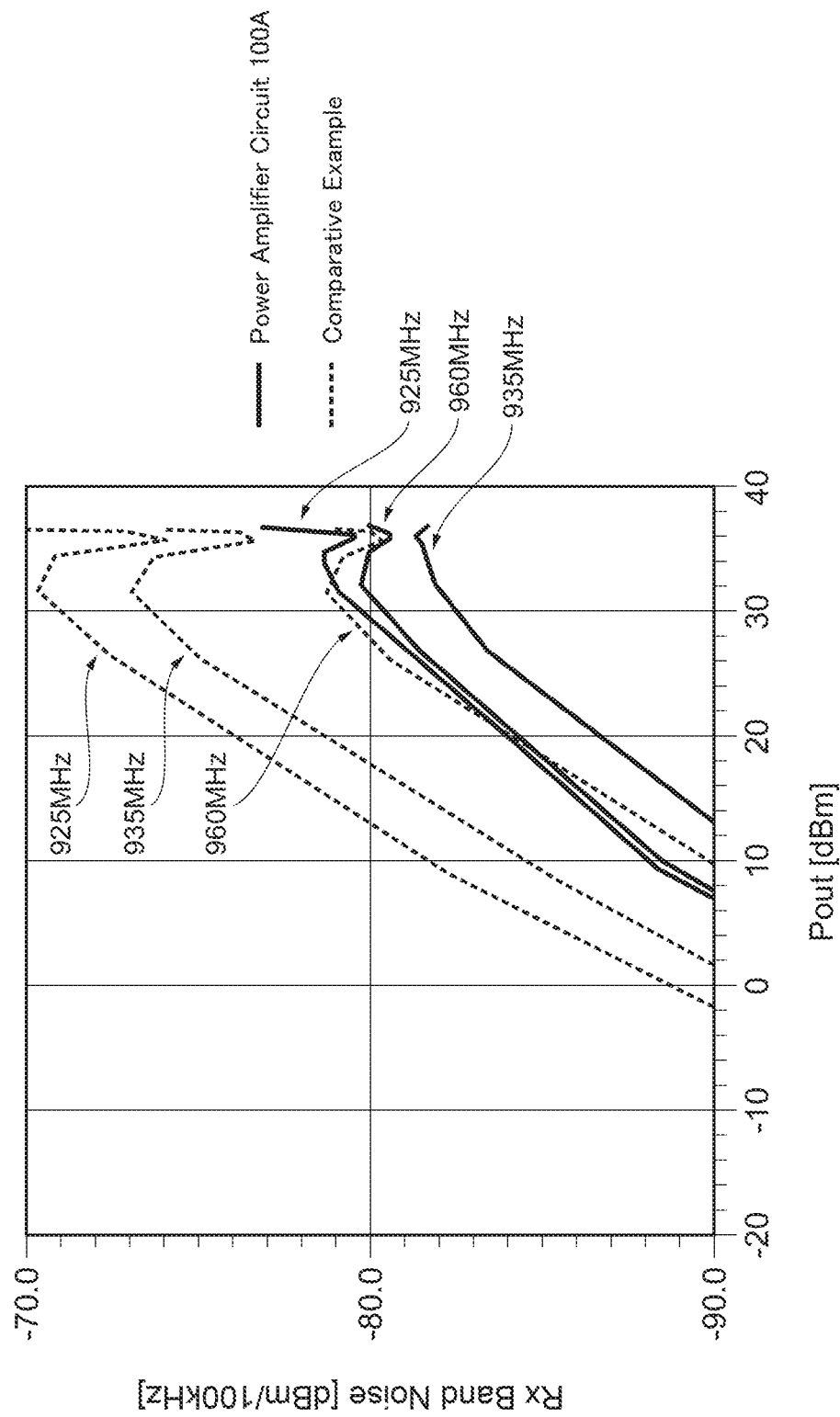
FIG. 6 is a graph illustrating the simulation results of the receiving band noises in a power amplifier circuit 100A and a power amplifier circuit according to a comparative example.

FIG. 6 is a graph illustrating the simulation results of the receiving band noises in the power amplifier circuit 100A and a power amplifier circuit according to a comparative example. More specifically, FIG. 6 is a diagram illustrating the powers of three different receiving band noises (925 MHz, 935 MHz and 960 MHz) generated when a transmission signal is amplified. The power amplifier circuit according to the comparative example has a configuration that does not include the feedback circuit 130, which is included in the configuration of the power amplifier circuit 100A. In the graph illustrated in FIG. 6, the axis of abscissa indicates output power Pout (dBm) and the axis of ordinate indicates receiving band noise (dBm/100 kHz).

As illustrated in FIG. 6, according to the power amplifier circuit 100A of the present embodiment, the receiving band noises in all the three different frequency bands are reduced, as compared with the power amplifier circuit of the comparative example. This can be said to indicate the effect of the feedback circuit 130.

Figure 7:
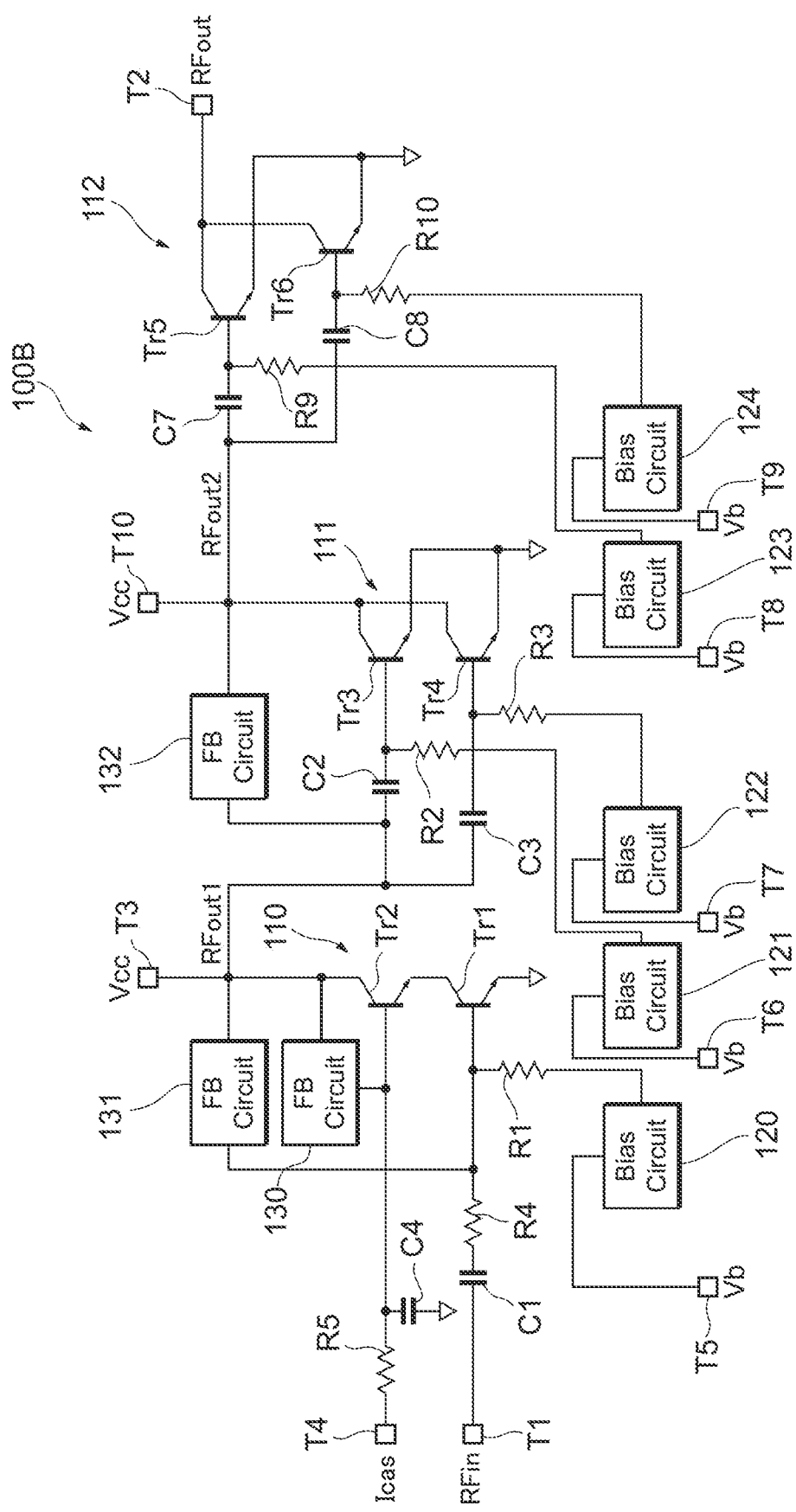
FIG. 7 is a diagram illustrating a configuration example of a power amplifier circuit according to a second embodiment of the present disclosure.

FIG. 7 is a diagram illustrating a configuration example of a power amplifier circuit according to a second embodiment of the present disclosure. The like elements as those of the power amplifier circuit 100A illustrated in FIG. 1 will be assigned the like reference numerals, and the descriptions thereof will be omitted. For the second embodiment and after, the descriptions of the same aspects as those of the first embodiment will be omitted, and only different aspects will be described. In particular, the same operation and effect as those obtained by the same configuration will not be repeatedly mentioned for each embodiment.

A power amplifier circuit 100B illustrated in FIG. 7 is different from the power amplifier circuit 100A illustrated in FIG. 1 in that the power amplifier circuit 100B includes three stages of amplifiers. More specifically, the power amplifier circuit 100B includes an amplifier 112 in the third stage, bias circuits 123, 124, capacitors C7, C8, resistance elements R9, R10, and a feedback circuit 132 in addition to the elements included in the configuration of the power amplifier circuit 100A.

The amplifier 112 in the third stage includes transistors Tr5, Tr6. The amplifier 112 amplifies an amplified signal RFout2 supplied from an amplifier 111 in the second stage and outputs an amplified signal RFout from an output terminal T2.

The configurations of the transistors Tr5, Tr6, the bias circuits 123, 124, the capacitors C7, C8, the resistance elements R9, R10, and terminals T8, T9 related to the amplifier 112 in the third stage are the same, respectively, as the configurations of the transistors Tr3, Tr4, the bias circuits 121, 122, the capacitors C2, C3, the resistance elements R2, R3, and the terminals T6, T7 related to the amplifier 111 in the second stage, so that detailed descriptions thereof will be omitted.

The feedback circuit 132 is provided between the collector and the base of the transistor Tr3 in the amplifier 111 in the second stage. The feedback circuit 132 can be configured using the same elements as those of the feedback circuit 131 illustrated in FIG. 3, and has a function for suppressing the oscillation, as with the feedback circuit 131. A supply voltage Vcc is supplied from a terminal T10 to the collectors of the transistors Tr3, Tr4.

The power amplifier circuit 100b having the configuration described above can also provide the same effect as that of the power amplifier circuit 100A. Further, the power amplifier circuit 100B amplifies the power of an RF signal by three stages, so that an amplified signal RFout having higher power, as compared with the power amplifier circuit 100A, can be output.

The amplifier in the third stage may be provided with the same feedback circuit as the feedback circuits 131, 132, as with the amplifiers in the first stage and the second stage.

Figure 8:
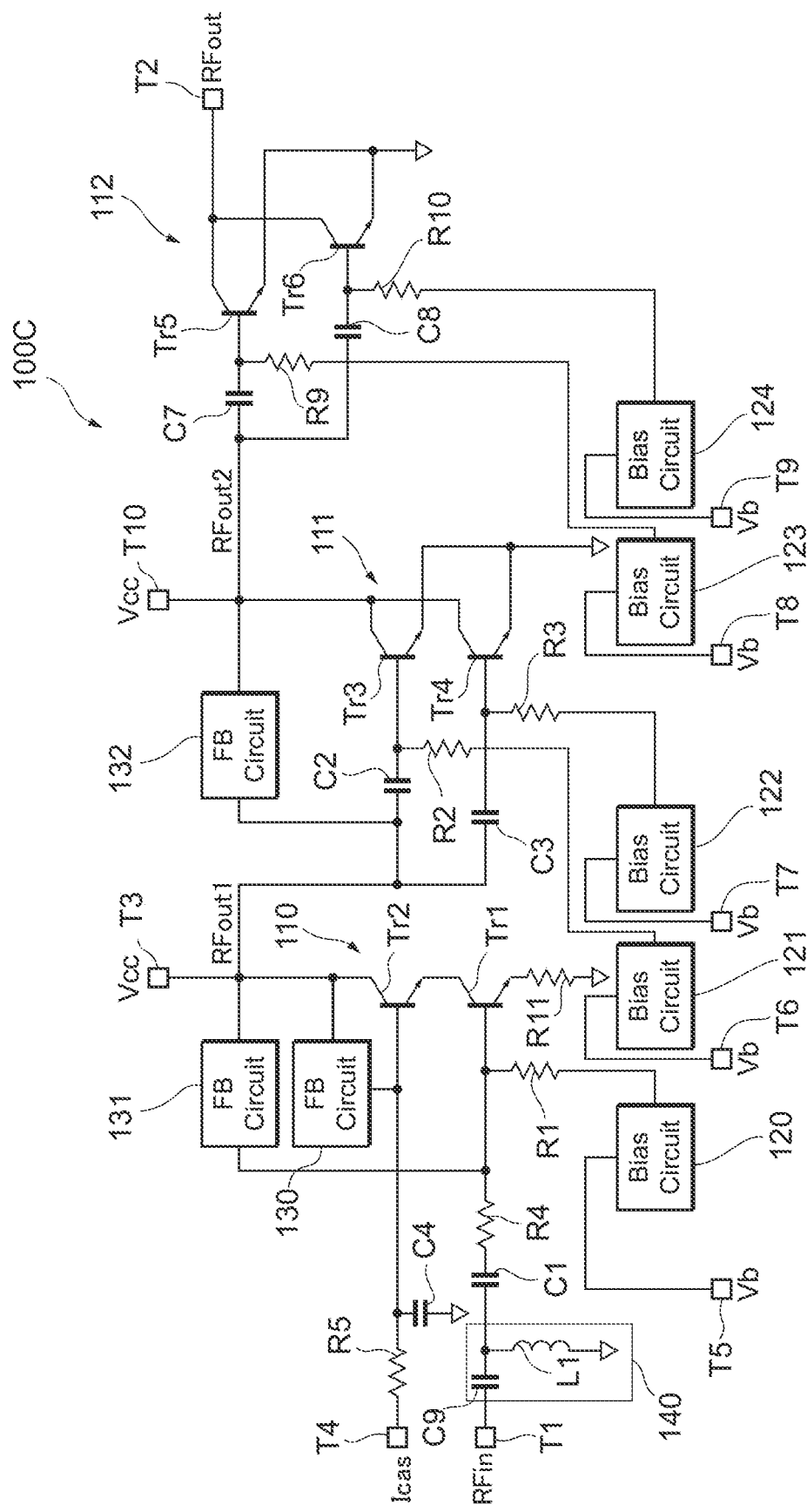
FIG. 8 is a diagram illustrating a configuration example of a power amplifier circuit according to a third embodiment of the present disclosure.

FIG. 8 is a diagram illustrating a configuration example of a power amplifier circuit according to a third embodiment of the present disclosure. In comparison with the power amplifier circuit 1006 illustrated in FIG. 7, a power amplifier circuit 100C illustrated in FIG. 8 further includes a resistance element R11 and a filter circuit 140.

The resistance element R11 is provided between the emitter of a transistor Tr1 and a ground (a specific example of a reference potential) in an amplifier 110 in a first stage.

A filter circuit 140 is provided between an input terminal T1 and the base of the transistor Tr1. More specifically, the filter circuit 140 includes a capacitor C9 and an inductor L1. The capacitor C9 is connected in series with a signal path of an RF signal RFin. The inductor L1 is connected between the signal path and the ground. Thus, the filter circuit 140 constitutes an L-type high pass filter circuit having a frequency characteristic that permits the passage of a signal having a frequency of the frequency band of the RF signal RFin and attenuates signals having frequencies that are lower than the frequency band of the RF signal RFin. The power amplifier circuit 100C provided with the filter circuit 140 can attenuate the noise having a frequency $f_{AC}$ included in the signal path of the RF signal RFin.

The power amplifier circuit 100C having the configuration described above can also provide the same effect as that of the power amplifier circuit 1006. Further, the power amplifier circuit 100C includes the resistance element R11 and the filter circuit 140, thus enabling the power amplifier circuit 100C to further suppress receiving band noises, as compared with the power amplifier circuit 1006.

Further, in the power amplifier circuit 100C, no resistance element is provided between the emitter and the ground in the transistors Tr3, Tr4 in the second stage and in the transistors Tr5, Tr6 in the third stage. With this arrangement, an increase in circuit scale can be suppressed, as compared with a configuration in which a resistance element is provided between the emitter and the ground in every transistor.

The power amplifier circuit 100C does not have to include both the resistance element R11 and the filter circuit 140, and may include only the resistance element R11 or the filter circuit 140. Further, the configuration of the filter circuit 140 is not limited to the above, and may alternatively be, for example, an L-type high pass filter circuit including a capacitor and a resistance element.

Figure 9:
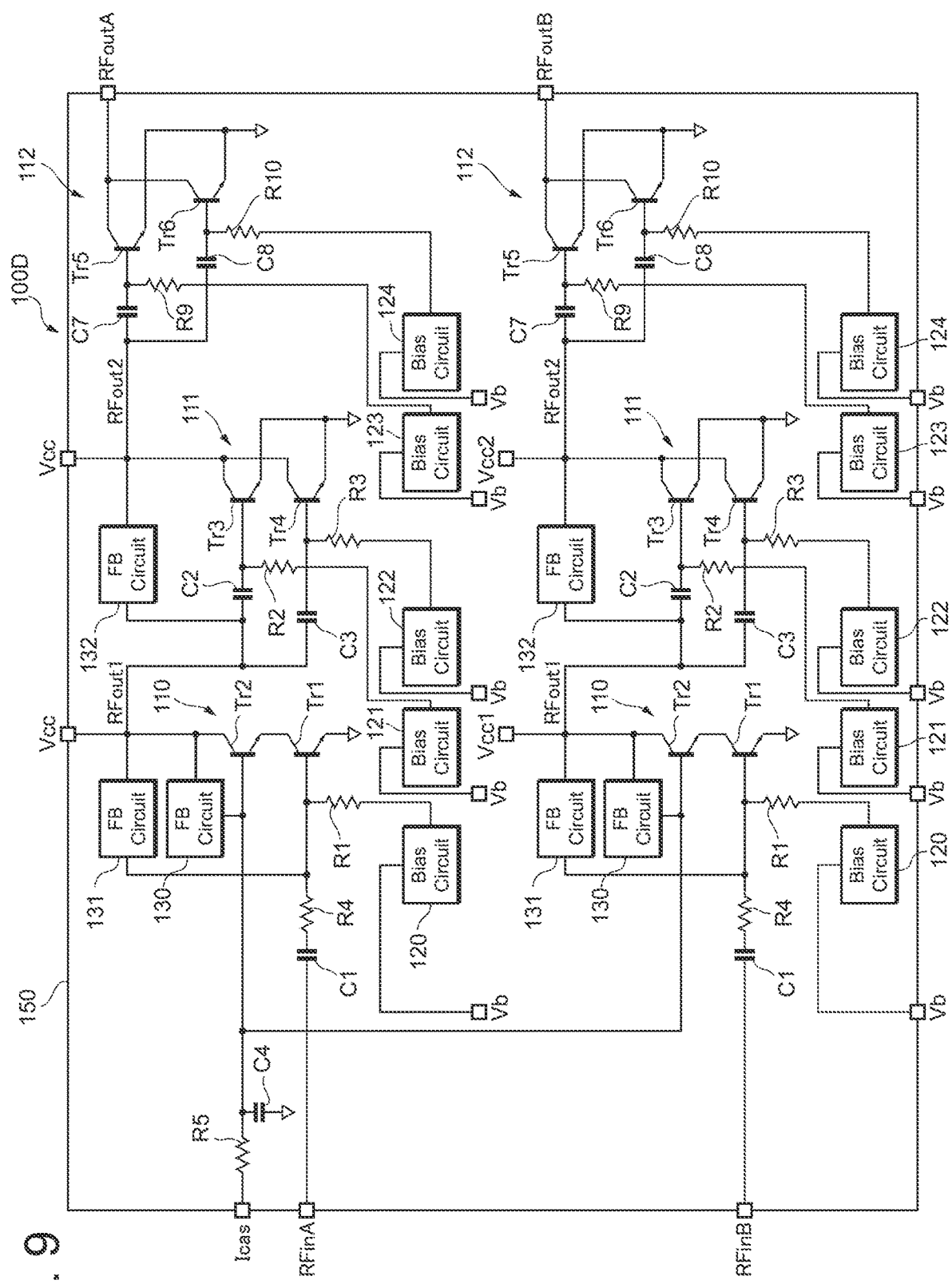
FIG. 9 is a diagram illustrating a configuration example of a power amplifier circuit according to a fourth embodiment of the present disclosure.

FIG. 9 is a diagram illustrating a configuration example of a power amplifier circuit according to a fourth embodiment of the present disclosure. A power amplifier circuit 100D illustrated in FIG. 9 is configured by including two power amplifier circuits 100B, one of which is illustrated in FIG. 7.

More specifically, the power amplifier circuit 100D has two signal paths formed on a single board 150. The signal paths amplify RF signals RFinA and RFinB, which are different from each other, and output the amplified signals RFoutA and RFoutB. The RF signals RFinA and RFinB may be, for example, a combination of different frequency bands in the same communication standard or a combination of different communication standards. The combination of different communication standards may be, for example, a combination of any two of the following: the second-generation mobile communication system (2G), the third-generation mobile communication system (3G), the fourth-generation mobile communication system (4G), the fifth-generation mobile communication system (5G), the long term evolution (LTE)-frequency division duplex (FDD), the LTE-time division duplex (TDD), the LTE-Advanced, the LTE-Advanced Pro, the Wi-Fi, the Bluetooth (registered trademark), the license-assisted access using LTE (LAA-LTE), and the like. The elements included in the signal paths are the same as those of the power amplifier circuit 100B, so that like reference numerals will be assigned and the descriptions thereof will be omitted.

The power amplifier circuit 100D having the configuration described above can also provide the same effect as that of the power amplifier circuit 1006. In addition, the two signal paths are formed on the single board 150, thus making it possible to suppress an increase in circuit area, as compared with a configuration in which the two signal paths are formed on different boards.

FIG. 9 illustrates a configuration of the power amplifier circuit 1006 as an example of the signal paths formed on the board 150. Alternatively, however, the signal paths may be configured by other power amplifier circuits 100A and 100C.

Further, FIG. 9 illustrates an example in which the two signal paths are formed on the board 150; alternatively, however, three or more signal paths may be formed on the board 150.

The above has described illustrative embodiments of the present disclosure. The power amplifier circuits 100A to 100D include the first transistor Tr1, which amplifies the first signal input to the base or the gate thereof, the bias circuit 120, which supplies a bias current or voltage based on a control signal to the base or the gate of the first transistor, the second transistor Tr2, in which the control current Icas based on a control signal is supplied to the base or the gate thereof, the emitter or the source thereof is connected to the collector or the drain of the first transistor Tr1, and which outputs the second signal obtained by amplifying the first signal from the collector or the drain thereof, and the first feedback circuit 130 provided between the collector or the drain of the second transistor Tr2 and the base or the gate of the second transistor Tr2. This arrangement reduces the gain of the transistor Tr2, so that the conversion gain of the amplifier including the transistors Tr1, Tr2 is reduced accordingly. Hence, the power amplifier circuits 100A to 100D make it possible to suppress the occurrence of receiving band noises while enabling control of an output power level.

Further, the first feedback circuit 130 includes, for example, the first capacitor C5 and the first resistance element R6 interconnected in series. This enables the feedback amount to be adjusted by the resistance value of the first resistance element R6 while feeding back the output of the transistor Tr2.

Further, the power amplifier circuits 100A to 100D further include the second feedback circuit 131 provided between the collector or the drain of the second transistor Tr2 and the base or the gate of the first transistor Tr1. This suppresses the oscillation of the amplifier including the transistors Tr1, Tr2, leading to improved stability.

Further, the second feedback circuit 131 includes, for example, the second capacitor C6 and the second resistance element R7, which are interconnected in series. This enables the gain of the transistor Tr1 to be adjusted by the resistance value of the second resistance element R7 while securing the stability of the amplifiers.

Further, the capacitance value of the second capacitor C6 may be smaller than the capacitance value of the first capacitor C5. This causes the gain of the first transistor Tr1 to increase, thus preventing the gain of the amplifier as a whole from decreasing. In addition, the resistance value of the second resistance element R7 can be decreased, so that the thermal noise in the resistance element can be suppressed.

Further, the power amplifier circuit 100C further includes the filter circuit 140, which is provided between the base or the gate of the first transistor Tr1 and the input terminal, and which allows the first signal to pass therethrough and attenuates signals having frequencies that are lower than the frequency band of the first signal. With this arrangement, noises which are included in the first signal and which have frequencies that are relatively low can be attenuated, thus making it possible to suppress the receiving band noises.

The embodiments described above are intended for easy understanding of the present disclosure and are not to be interpreted as limiting the present disclosure. The present disclosure may be modified or improved without departing from the spirit of the present disclosure, and equivalents thereof are also covered by the present disclosure. In other words, those obtained by adding design changes, as appropriate, to the embodiments by persons skilled in the art are encompassed by the scope of the present disclosure insofar as the characteristics of the present disclosure are incorporated. For example, the elements provided in the embodiments, and the placement, the materials, the conditions, the shapes, the sizes, and the like of the elements are not limited to the illustrated ones and may be changed, as appropriate. Further, the elements provided in the embodiments may be combined insofar as the combinations are technologically possible, and such combinations are to be covered by the scope of the present disclosure insofar as the characteristics of the present disclosure are incorporated.

DESCRIPTION OF REFERENCE NUMERALS 100A to 100D . . . . Power amplifier circuit; 110 to 112 . . . . Amplifier; 120 to 122 . . . . Bias circuit; 130 to 132 . . . . Feedback circuit; 140 . . . . Filter circuit; 150 . . . . Board; 200, 201 . . . . Diode; 210 . . . . Transistor; 220 . . . . Resistance element; Tr1 to Tr6 . . . . Transistor; C1 to C9 . . . . Capacitor; R1 to R11 . . . . Resistance element; L1 . . . . Inductor; T1 . . . . Input terminal; T2 . . . . Output terminal; and T3 to T10 . . . . Terminal.

What is claimed is:

1. A power amplifier circuit comprising:
a first transistor configured to amplify a first signal input to a base or a gate of the first transistor;
a bias circuit configured to supply a bias current or a bias voltage based on a control signal to the base or the gate of the first transistor;
a second transistor configured to output a second signal, wherein a control current based on the control signal is supplied to a base or a gate of the second transistor, an emitter or a source of the second transistor is connected to a collector or a drain of the first transistor, and the second signal is output from a collector or a drain of the second transistor, the second signal being obtained by amplifying the first signal;
a first feedback circuit connected between the collector or the drain of the second transistor and the base or the gate of the second transistor; and
a second feedback circuit connected between the collector or the drain of the second transistor and the base or the gate of the first transistor,
wherein the first feedback circuit comprises a first capacitor,
wherein the second feedback circuit comprises a second capacitor, and
wherein a capacitance value of the second capacitor is less than a capacitance value of the first capacitor.

2. The power amplifier circuit according to claim 1, wherein the first feedback circuit comprises a first capacitor and a first resistance element connected in series.

3. The power amplifier circuit according to claim 1, wherein the second feedback circuit comprises a second capacitor and a second resistance element connected in series.

4. The power amplifier circuit according to claim 1, further comprising:
a filter circuit connected between the base or the gate of the first transistor and an input terminal of the power amplifier circuit, wherein the filter circuit is configured to pass the first signal and to attenuate a signal having a frequency that is lower than a frequency band of the first signal.

5. The power amplifier circuit according to claim 2, further comprising:
a filter circuit connected between the base or the gate of the first transistor and an input terminal of the power amplifier circuit, wherein the filter circuit is configured to pass the first signal and to attenuate a signal having a frequency that is lower than a frequency band of the first signal.

6. The power amplifier circuit according to claim 3, further comprising:
a filter circuit connected between the base or the gate of the first transistor and an input terminal of the power amplifier circuit, wherein the filter circuit is configured to pass the first signal and to attenuate a signal having a frequency that is lower than a frequency band of the first signal.

7. The power amplifier circuit according to claim 4, wherein the filter circuit comprises a capacitor connected in series between the input terminal and the base or the gate of the first transistor, and an inductance element connected between a reference potential and a node between the capacitor of the filter circuit and the base or the gate of the first transistor.

8. The power amplifier circuit according to claim 1, further comprising a resistance element connected between an emitter or a source of the first transistor and a reference potential.

9. The power amplifier circuit according to claim 4, further comprising a resistance element connected between an emitter or a source of the first transistor and a reference potential.

* * * * *

UNITED STATES PATENT AND TRADEMARK OFFICE
CERTIFICATE OF CORRECTION

| | | |
|---|---|---|
| PATENT NO. | : 11,463,060 B2 | Page 1 of 1 |
| APPLICATION NO. | : 17/038988 | |
| DATED | : October 4, 2022 | |
| INVENTOR(S) | : Yuri Honda et al. | |

It is certified that error appears in the above-identified patent and that said Letters Patent is hereby corrected as shown below:

In the Specification

Column 8, Line 55, "1006" should be -- 100B --.

Column 9, Line 1, "1006" should be -- 100B --.

Column 9, Line 24, "1006" should be -- 100B --.

Column 9, Line 28, "1006" should be -- 100B --.

Column 10, Line 5, "1006" should be -- 100B --.

Column 10, Line 11, "1006" should be -- 100B --.

Signed and Sealed this
Eighteenth Day of July, 2023

*Katherine Kelly Vidal*

Katherine Kelly Vidal
*Director of the United States Patent and Trademark Office*